(12) United States Patent
Tanobe et al.

(10) Patent No.: US 12,203,968 B2
(45) Date of Patent: Jan. 21, 2025

(54) HIGH-FREQUENCY NOISE DETECTION ANTENNA

(71) Applicant: Nippon Telegraph and Telephone Corporation, Tokyo (JP)

(72) Inventors: Hiromasa Tanobe, Tokyo (JP); Yuichi Okabe, Tokyo (JP); Satoshi Tsunashima, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 242 days.

(21) Appl. No.: 17/770,017

(22) PCT Filed: Oct. 29, 2019

(86) PCT No.: PCT/JP2019/042292
§ 371 (c)(1),
(2) Date: Apr. 18, 2022

(87) PCT Pub. No.: WO2021/084600
PCT Pub. Date: May 6, 2021

(65) Prior Publication Data
US 2022/0390497 A1    Dec. 8, 2022

(51) Int. Cl.
*H01Q 1/36* (2006.01)
*G01R 29/10* (2006.01)
*H01Q 1/48* (2006.01)

(52) U.S. Cl.
CPC .............. *G01R 29/10* (2013.01); *H01Q 1/36* (2013.01); *H01Q 1/48* (2013.01)

(58) Field of Classification Search
CPC .... G01R 29/10; G01R 29/26; G01R 29/0814; G01R 1/06772; H01Q 1/36; H01Q 15/16; H01Q 5/45
See application file for complete search history.

(56) References Cited

U.S. PATENT DOCUMENTS

| | | | | |
|---|---|---|---|---|
| 5,399,999 | A * | 3/1995 | Eisenhart | H01P 1/16 315/5 |
| 8,866,691 | B2 * | 10/2014 | Montgomery | H01Q 9/285 343/792 |
| 10,778,286 | B2 * | 9/2020 | Henry | H01P 3/10 |
| 11,043,750 | B2 * | 6/2021 | Sezai | H01Q 15/16 |

(Continued)

FOREIGN PATENT DOCUMENTS

| | | |
|---|---|---|
| JP | 3071497 B2 | 7/2000 |
| WO | 2004107401 A2 | 12/2004 |
| WO | WO-2007091578 A1 * | 8/2007 ............... H01Q 1/36 |

*Primary Examiner* — Graham P Smith
*Assistant Examiner* — Austin M Back
(74) *Attorney, Agent, or Firm* — Slater Matsil, LLP

(57) ABSTRACT

A high-frequency noise detection antenna is provided with a fine coaxial line that includes a center conductor, an insulator provided so as to surround the whole periphery of the center conductor, and a ground shield provided so as to surround the whole periphery of the insulator, and in which a tip of the center conductor is exposed so as to protrude from the end of the insulator and the end of the ground shield, and an exposed ground shield provided so as to protrude from the end of the ground shield and surround a part in a circumferential direction of an exposed portion from which the center conductor protrudes.

13 Claims, 9 Drawing Sheets

(56) References Cited

U.S. PATENT DOCUMENTS

| | | | | |
|---|---|---|---|---|
| 2005/0099191 A1* | 5/2005 | Gleason | ............ | G01R 1/06772 |
| | | | | 324/755.01 |
| 2010/0000297 A1* | 1/2010 | Jones | ..................... | G01M 3/26 |
| | | | | 73/40 |
| 2018/0108966 A1* | 4/2018 | Lee | ....................... | H01Q 13/08 |
| 2018/0296267 A1* | 10/2018 | Hancock | ........... | A61M 25/0084 |

* cited by examiner

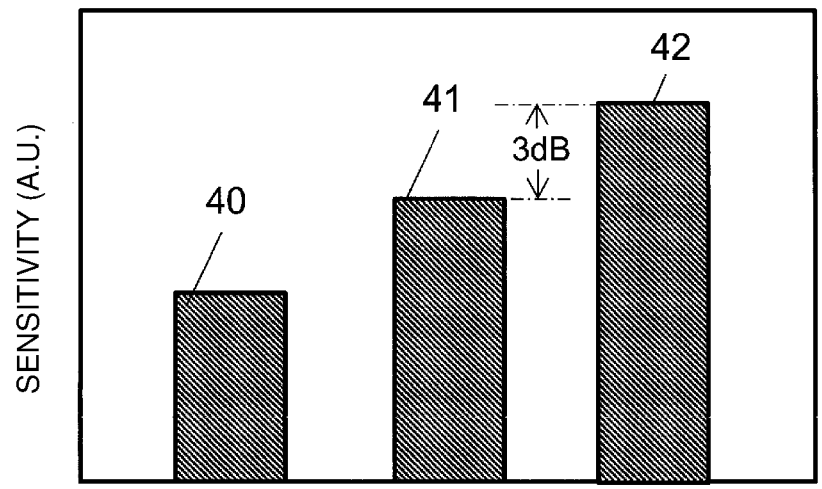
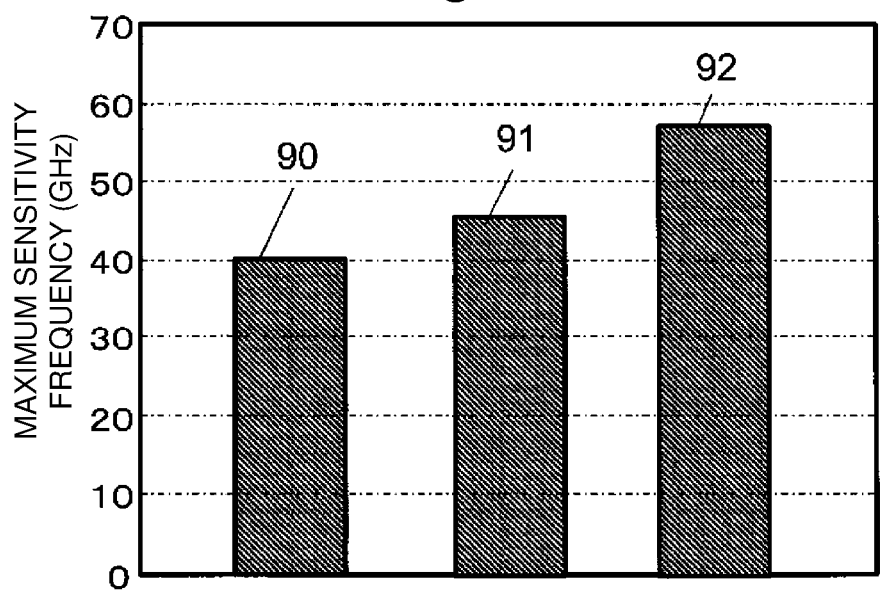

HIGH-FREQUENCY NOISE DETECTION ANTENNA

This patent application is a national phase filing under section 371 of PCT application no. PCT/JP2019/042292, filed on Oct. 29, 2019, which application is hereby incorporated herein by reference in its entirety.

TECHNICAL FIELD

The present invention relates to a high-frequency noise detection antenna capable of highly sensitively detecting high-frequency noise radiated into space from a minute-shaped component.

BACKGROUND

Advances in optical communication technologies have accelerated research and development to improve bit rates. Nowadays, high-frequency signals, handled by an optical transceiver that transmits and receives optical signals and an optical module mounted on the optical transceiver, have been used in further broad bands, and stable propagation of high-frequency signals is being required even inside the optical module. Further, in recent research and development for 1Tbps-transmission, the achievement of an optical module with a band of 50 GHz or more is indispensable, and the advancement of high-frequency design in the optical module and new development of evaluation technology are being promoted concurrently.

Various high-frequency components and optical semiconductor components are mounted inside the optical module. When a characteristic impedance mismatch occurs at the connection of these components, radiation of a high-frequency signal into space may occur physically. This radiation becomes high-frequency noise, and the high-frequency noise is superimposed on the characteristic of the optical module, thereby causing the characteristic of the optical module to deteriorate. However, it has been considered difficult to accurately identify a location where high-frequency noise emitted into space has been generated because of a detection limit of a detector due to a handled frequency being as high as about 50 GHz and because of the difficulty in probing due to the fact that the noise generating location itself is a small region.

Japanese Patent No. 3071497 proposes a method for detecting noise of a high frequency with an electric field detector. FIG. 12 is a diagram illustrating a configuration of a conventional electric field sensor disclosed in Japanese Patent No. 3071497. A continuous wave (CW) light source 100 makes an unmodulated optical signal incident on an optical modulator 102 through an optical fiber 101. The optical fiber 101 performs optical transmission in a single mode and holds the polarization plane of the optical wave of the optical signal. The optical signal incident on the optical modulator 102 passes through a lens 103, through a polarizer 104, and through an optical crystal 105. The polarizer 104 makes only a linearly polarized optical signal, inclined at 45° with respect to the optical axis of the optical crystal 105, incident on the optical crystal 105. The optical signal incident on the optical crystal 105 is phase-modulated by the voltage applied to optical modulator electrodes 107a, 107b due to an electric field detected by electric field detection probes 106a, 106b and is output to a phase compensator 108 as an elliptically polarized wave. Further, an analyzer 109 extracts a specific polarization component from the elliptically polarized component. The intensity-modulated optical signal having passed through the analyzer 109 passes through a lens no and is transmitted to a photodetector 112 by an optical fiber 111. The photodetector 112 converts the optical signal into an electrical signal by means of an avalanche photodiode. A level measurement instrument 113 measures the voltage of the signal output from the photodetector 112.

As thus described, the electric field sensor disclosed in Japanese Patent No. 3071497 drives the optical modulator 102 with high-frequency noise to be detected and measures the level of modulation obtained by passing the output light of the CW light source 100 through the optical modulator 102, thus measuring the electric field intensity.

However, in the electric field sensor illustrated in FIG. 12, due to the need for constructing a spatial optical system for guiding the continuous oscillation light of the CW light source 100 to the optical modulator 102, it has been difficult to reduce the size of the sensor to about 1 mm, and it has also been difficult to perform detection at a high frequency around 50 GHz. The size of the high-frequency noise generating location inside the optical module is about 1 mm, and a small electric field sensor, that is, a high-frequency noise antenna, has been required.

CITATION LIST

Patent Literature

Patent Literature 1: Japanese Patent No. 3071497

SUMMARY

Technical Problem

An embodiment of the present invention provides a small high-frequency noise detection antenna capable of highly sensitively detecting high-frequency noise radiated into space.

Means for Solving the Problem

A high-frequency noise detection antenna of embodiments of the present invention includes: a fine coaxial line that includes a center conductor, a first insulator provided so as to surround a whole periphery of the center conductor, and a first ground shield provided so as to surround a whole periphery of the first insulator, and in which a tip of the center conductor is exposed so as to protrude from an end of the first insulator and an end of the first ground shield; and a second ground shield provided so as to protrude from the end of the first ground shield and surround a part in a circumferential direction of an exposed portion from which the center conductor protrudes.

Effects of Embodiments of the Invention

According to embodiments of the present invention, by providing the fine coaxial line in which the tip of the center conductor protrudes from the end of the first insulator and the end of the first ground shield and the second ground shield provided so as to protrude from the end of the first ground shield and surround a part in the circumferential direction of the exposed portion from which the center conductor protrudes, the second ground shield can have the function of a reflection plate for high-frequency noise to be detected. In embodiments of the present invention, the radiation of the electromagnetic field noise from the object to be measured can be directly received by the exposed portion of the center conductor, and the electromagnetic field noise, which was unable to be directly received by the exposed portion, is reflected at the second ground shield, so that the reflected wave can be received by the exposed portion. As a result, according to embodiments of the present invention, it is possible to achieve a small high-frequency noise detection antenna capable of highly sensitively detecting high-frequency noise.

BRIEF DESCRIPTION OF THE DRAWINGS

FIG. 8 is a diagram illustrating sensitivity characteristics of a monopole antenna and the high-frequency noise detection antennas according to the first and second embodiments of the present invention.

FIG. 9 is a diagram illustrating the maximum sensitivity frequencies of the monopole antenna and the high-frequency noise detection antennas according to the first and second embodiments of the present invention.

DETAILED DESCRIPTION OF ILLUSTRATIVE EMBODIMENTS

Hereinafter, embodiments of the present invention will be described in detail with reference to the drawings.

First Embodiment

Figure 1:
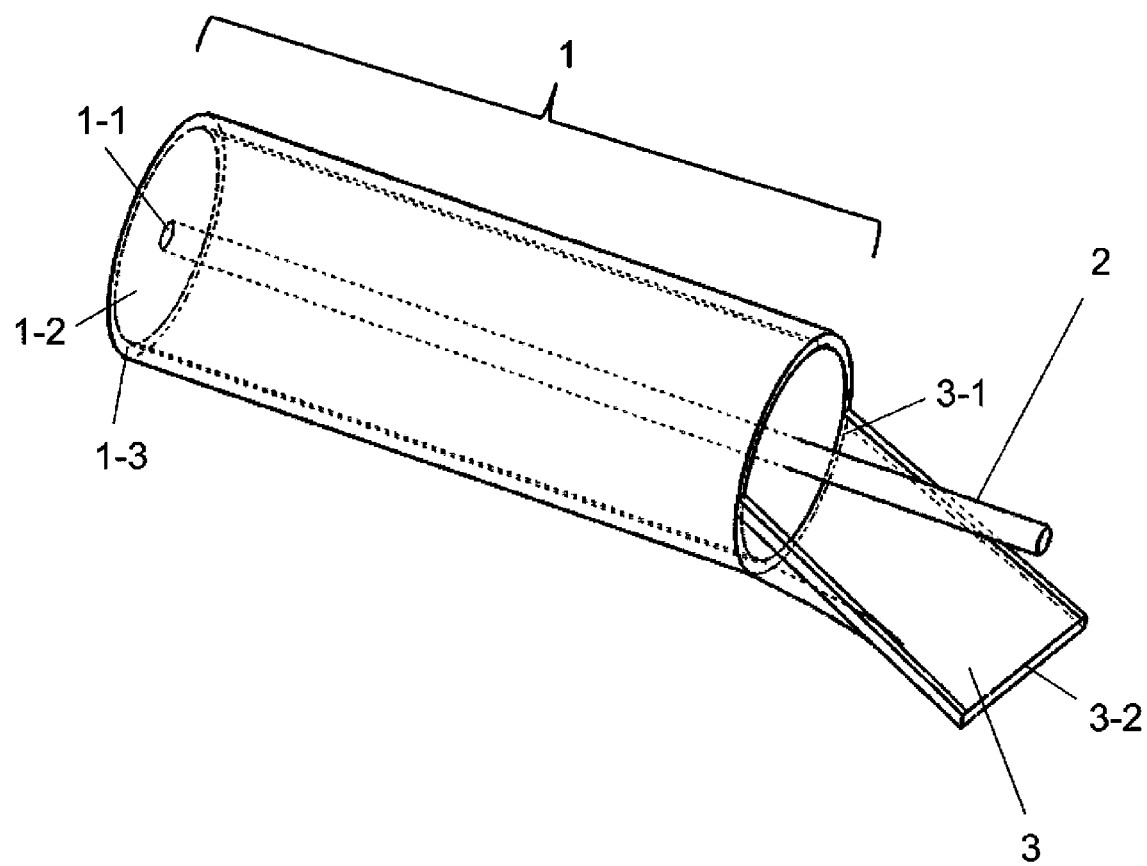
FIG. 1 is an overhead perspective view of a high-frequency noise detection antenna according to a first embodiment of the present invention.
Figure 2:
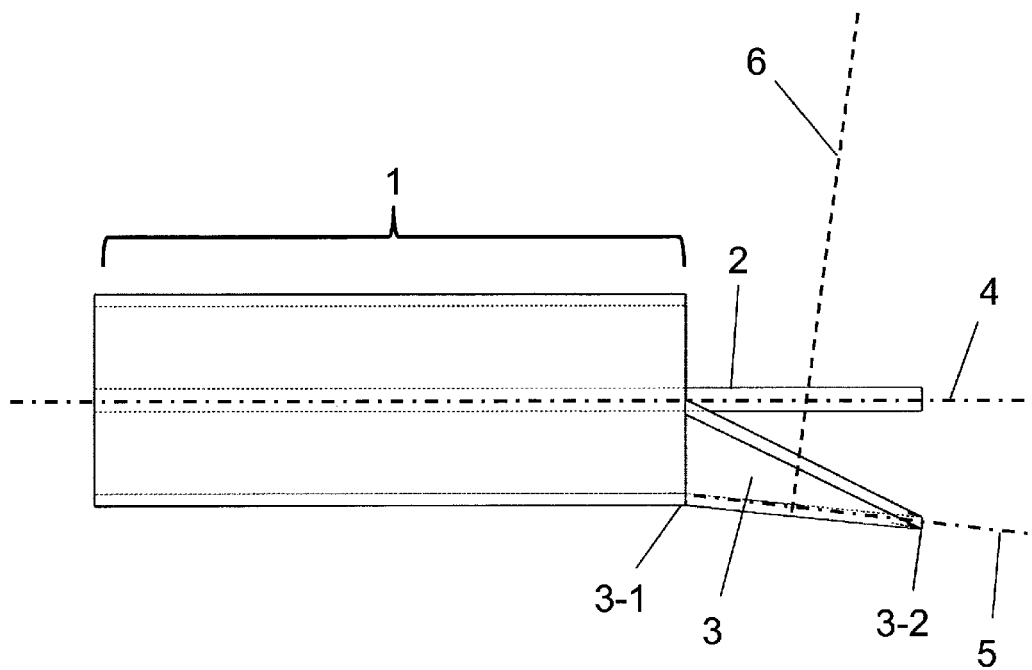
FIG. 2 is a side perspective view of the high-frequency noise detection antenna according to the first embodiment of the present invention.
Figure 3:
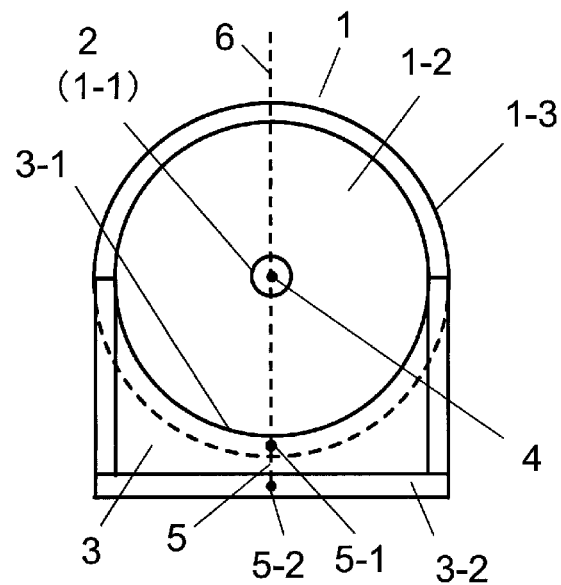
FIG. 3 is a front view of the high-frequency noise detection antenna according to the first embodiment of the present invention.

FIG. 1 is an overhead perspective view of a high-frequency noise detection antenna according to a first embodiment of the present invention, FIG. 2 is a side perspective view of the high-frequency noise detection antenna of FIG. 1, and FIG. 3 is a front view of the high-frequency noise detection antenna of FIG. 1.

The high-frequency noise detection antenna of the present embodiment is provided with: a fine coaxial line 1 that includes a center conductor 1-1, an insulator 1-2 with a circular pipe form provided so as to surround the whole periphery of the center conductor 1-1, and a ground shield 1-3 with a circular pipe form provided so as to surround the whole periphery of the insulator 1-2, and in which a tip of the center conductor 1-1 is exposed to form an exposed portion 2 that protrudes from the end of the insulator 1-2 and the end of the ground shield 1-3; and an exposed ground shield 3 electrically connected to the ground shield 1-3 and provided so as to protrude from the end of the ground shield 1-3 and surround in a circumferential direction a part of the exposed portion 2 of the center conductor 1-1.

The diameter of the center conductor 1-1 is, for example, about 150 μm, and the diameter of the fine coaxial line 1 (ground shield 1-3) is, for example, 1 mm or less. The length of the exposed portion 2 of the center conductor 1-1 will be described later.

A connection 3-1 of the exposed ground shield 3 with the ground shield 1-3 has a semicircular shape in the cross-section perpendicular to the extending direction of the center conductor 1-1 and has the same curvature radius as the curvature radius of the ground shield 1-3. On the other hand, it is desirable that a tip portion 3-2 of the exposed ground shield 3 have a predetermined curvature radius larger than the curvature radius of the fine coaxial line 1 (ground shield 1-3) and that a capacitance be provided between the exposed portion 2 of the center conductor 1-1 and the exposed ground shield 3. That is, the curvature radius of the cross-section of the exposed ground shield 3 gradually increases toward the tip side of the center conductor 1-1.

In order to manufacture the exposed portion 2 of the center conductor 1-1 and the exposed ground shield 3 as described above, the resin insulator 1-2 provided so as to surround the whole periphery of the center conductor 1-1 may be removed to expose the center conductor 1-1, and the ground shield 1-3 around the exposed portion 2 may be molded to form the exposed ground shield 3. However, in the example of FIGS. 1 to 3, the curvature radius of the tip portion 3-2 of the exposed ground shield 3 is set to infinity, that is, to be in a substantially straight-line state, for convenience of processing in an actual experiment.

As illustrated in FIGS. 2 and 3, a straight line 5 connecting a center 5-1 of the cross-section of the connection 3-1 of the exposed ground shield 3 and a center 5-2 of the end face of the tip portion 3-2 of the exposed ground shield 3 is non-parallel to a center line 4 in the longitudinal direction of the center conductor 1-1 (the lateral direction in FIG. 2). By adjusting the angle formed by the straight line 5 and the center line 4 of the center conductor 1-1, it is possible to adjust the capability to detect the high-frequency noise in accordance with the object to be detected.

When the high-frequency noise detection antenna of the present embodiment is used to detect high-frequency noise, the high-frequency noise detection antenna may be disposed such that an object to be measured is located on an extended line of a perpendicular line 6 passing through the midpoint in the longitudinal direction of the exposed portion 2 of the center conductor 1-1 and perpendicular to the center line 5 in the longitudinal direction of the exposed ground shield 3. With this placement, radiation of electromagnetic field noise from the object to be measured can be directly received by the exposed portion 2. Further, electromagnetic field noise, which was unable to be directly received by the exposed portion 2, is reflected by the exposed ground shield 3, so that the reflected wave can be received by the exposed portion 2.

In the present embodiment, a so-called double-path monopole antenna structure is achieved.

Figure 4:
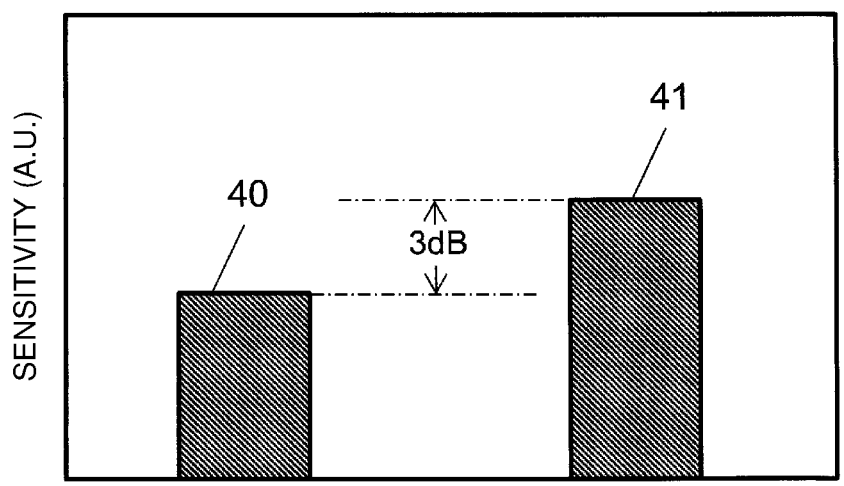
FIG. 4 is a diagram illustrating sensitivity characteristics of a monopole antenna and the high-frequency noise detection antenna according to the first embodiment of the present invention.

FIG. 4 illustrates sensitivity characteristics of a simple monopole antenna without the exposed ground shield 3 and the high-frequency noise detection antenna of the present embodiment. In FIG. 4, reference numeral 40 denotes the sensitivity characteristic of the monopole antenna, and reference numeral 41 denotes the sensitivity characteristic of the high-frequency noise detection antenna of the present embodiment. Here, peak values are illustrated when the result of receiving electromagnetic field noise of 40 GHz by the monopole antenna and the high-frequency noise detection antenna of the present embodiment is observed by a high-frequency spectrum analyzer.

In the present embodiment, the length of the exposed portion 2 of the center conductor 1-1 is set to about 1.9 mm. This length corresponds to ¼ wavelength in terms of an in-tube wavelength in a 40 GHz signal when air is used as an insulator. That is, the length of the exposed portion 2 of the center conductor 1-1 may be set to ¼ of the value obtained by converting the wavelength of the high-frequency noise to be detected into the in-tube wavelength.

As illustrated in the graph of FIG. 4, by the double path effect in the present embodiment, an improvement effect of about 3 dB in sensitivity has been obtained by actual measurement as compared with the monopole antenna, and the effectiveness of the present embodiment has been confirmed.

Figure 5:
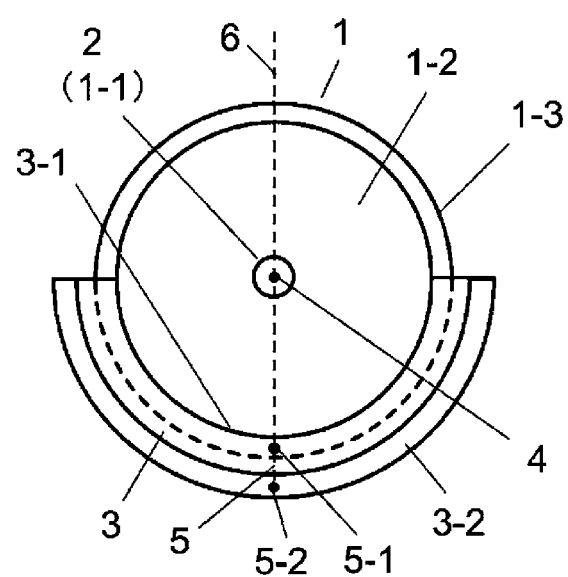
FIG. 5 is a front view illustrating another example of the high-frequency noise detection antenna according to the first embodiment of the present invention.

In the present embodiment, although the curvature radius of the tip portion 3-2 of the exposed ground shield 3 is infinity, FIG. 5 illustrates a front view of the high-frequency noise detection antenna in a case where the end face of the tip portion 3-2 has a semicircular shape (the curvature radius is finite). As described above, the curvature radius of the cross-section of the exposed ground shield 3 gradually increases toward the tip side of the center conductor 1-1.

Second Embodiment

Figure 6:
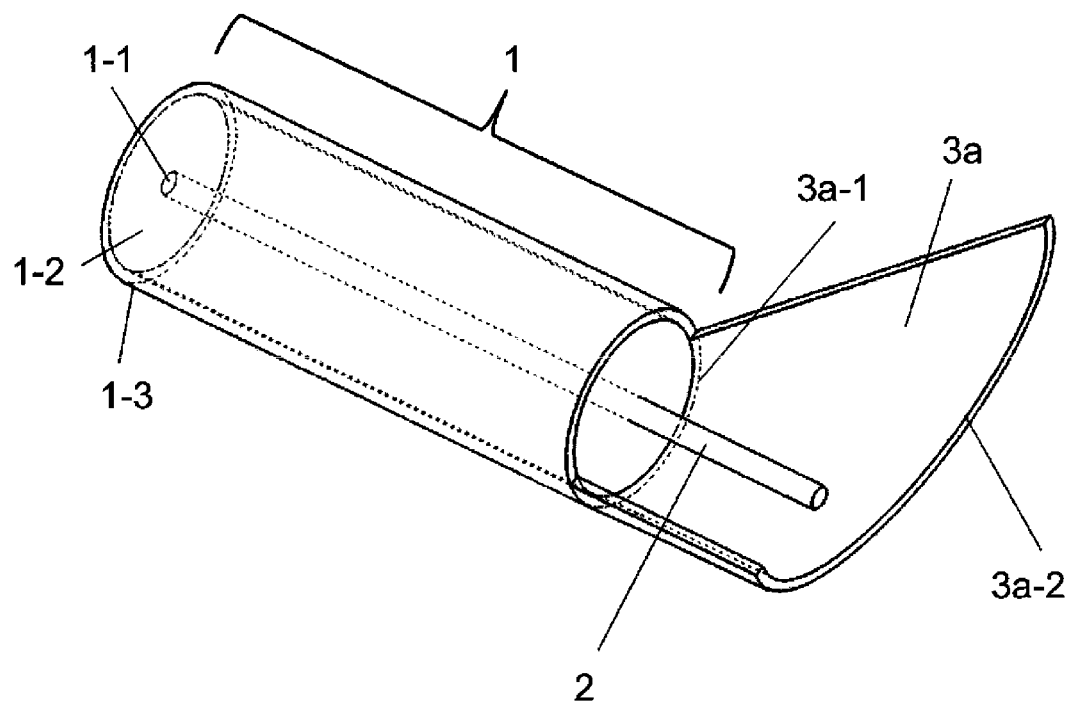
FIG. 6 is an overhead perspective view of a high-frequency noise detection antenna according to a second embodiment of the present invention.
Figure 7:
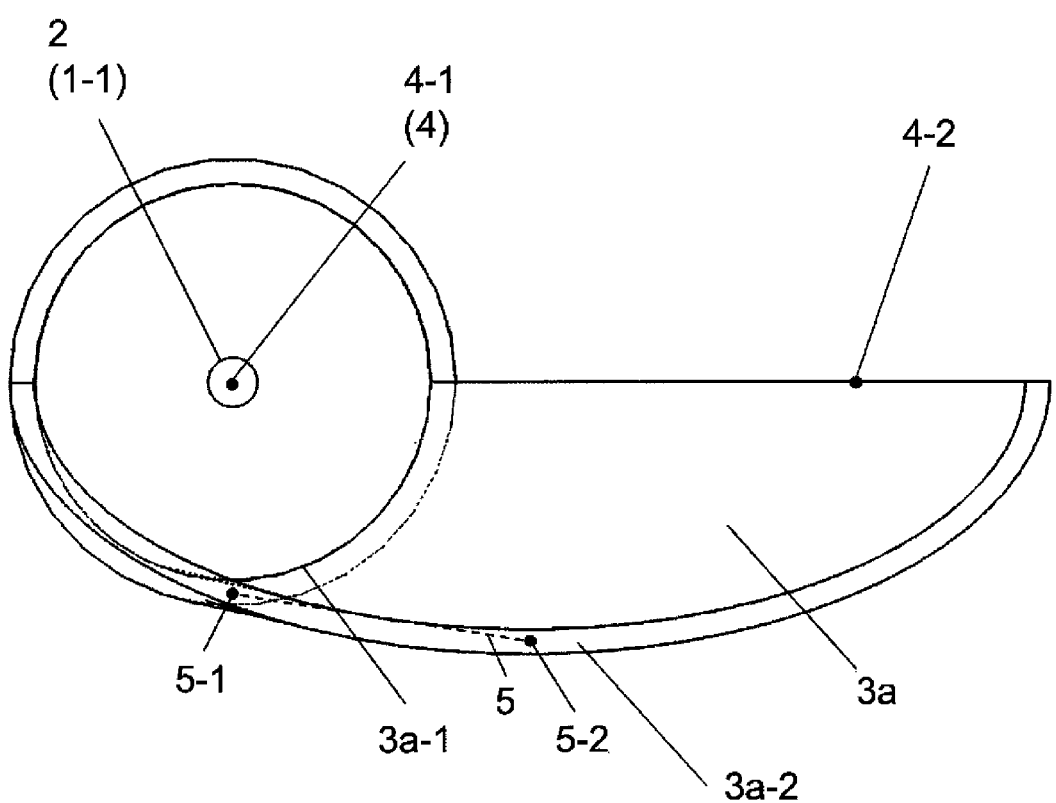
FIG. 7 is a front view of the high-frequency noise detection antenna according to the second embodiment of the present invention.

Next, a second embodiment of the present invention will be described. FIG. 6 is an overhead perspective view of a high-frequency noise detection antenna according to the second embodiment of the present invention, and FIG. 7 is a front view of the high-frequency noise detection antenna of FIG. 6. The high-frequency noise detection antenna of the present embodiment is provided with a fine coaxial line 1 and an exposed ground shield 3a electrically connected to a ground shield 1-3 of the fine coaxial line 1 and provided so as to protrude from the end of the ground shield 1-3 and surround in the circumferential direction a part of the protruded exposed portion 2 of the center conductor 1-1.

As in the first embodiment, a connection 3a-1 of the exposed ground shield 3a with the ground shield 1-3 has a semicircular shape in the cross-section perpendicular to the extending direction of the center conductor 1-1 and has the same curvature radius as the curvature radius of the ground shield 1-3.

On the other hand, the tip portion 3a-2 of the exposed ground shield 3a has a semi-elliptical shape on an end face perpendicular to the extending direction of the center conductor 1-1. The semi-elliptical major diameter of the tip portion 3a-2 is longer than the diameter of the fine coaxial line 1 (ground shield 1-3). That is, the shape of the cross-section of the exposed ground shield 3a changes from the semicircular shape to the semi-elliptical shape toward the tip side of the center conductor 1-1. Further, as illustrated in FIG. 7, the exposed ground shield 3a is entirely formed such that the position of a first confocal point (4-1 in FIG. 7) of two confocal points of the semi-elliptical end face of the tip portion 3a-2 coincides with the position of the tip of the exposed portion 2 of the center conductor 1-1.

As in the first embodiment, in order to manufacture the exposed portion 2 of the center conductor 1-1 and the exposed ground shield 3a, the insulator 1-2 may be removed to expose the center conductor 1-1, and the ground shield 1-3 around the exposed portion 2 may be molded to form the exposed ground shield 3a.

In the present embodiment as well, as illustrated in FIG. 7, it goes without saying that a straight line 5 connecting a center 5-1 of the cross-section of the connection 3a-1 of the exposed ground shield 3a and a center 5-2 of the end face of the tip portion 3a-2 of the exposed ground shield 3a is non-parallel to a center line 4 in the longitudinal direction of the center conductor 1-1.

When the high-frequency noise detection antenna of the present embodiment is used to detect high-frequency noise, the high-frequency noise detection antenna may be disposed such that the object to be measured is located at a second confocal point (4-2 in FIG. 7) of the semi-elliptical end face of the tip portion 3a-2 of the exposed ground shield 3a. With this placement, radiation of electromagnetic field noise from the object to be measured can be directly received by the exposed portion 2 of the center conductor 1-1. Further, the electromagnetic field noise can be highly efficiently collected on the exposed portion 2 of the center conductor 1-1 by forming the end face of the tip portion 3a-2 of the exposed ground shield 3a into a semi-elliptical shape. This allows the electromagnetic field noise failed to be directly received by the exposed portion 2 and then reflected on the exposed ground shield 3a to be received as a reflected wave by the exposed portion 2. In the present embodiment, a so-called double-path monopole antenna structure is achieved. In particular, when the object to be measured is small enough to fit inside the exposed ground shield 3a, the application effect of the present embodiment is high.

FIG. 8 illustrates sensitivity characteristics of a simple monopole antenna without the exposed ground shield 3a and the high-frequency noise detection antennas of the first embodiment and the present embodiment. In FIG. 8, reference numeral 40 denotes the sensitivity characteristic of the monopole antenna, reference numeral 41 denotes the sensitivity characteristic of the high-frequency noise detection antenna of the first embodiment, and reference numeral 42 denotes the sensitivity characteristic of the high-frequency noise detection antenna of the present embodiment. Here, peak values are illustrated in a case where the result of receiving electromagnetic field noise of 40 GHz by the monopole antenna and the high-frequency noise detection antenna of the first embodiment and the present embodiment is observed by a high-frequency spectrum analyzer.

In the first embodiment and the present embodiment, the length of the exposed portion 2 of the center conductor 1-1 is set to about 1.9 mm. As described in the first embodiment, the length of the exposed portion 2 of the center conductor 1-1 may be set to ¼ of the value obtained by converting the wavelength of the high-frequency noise to be detected into the in-tube wavelength.

As illustrated in the graph of FIG. 7, by the double path effect in the present embodiment, an improvement effect of about 3 dB has been obtained by actual measurement as compared with the first embodiment, and the effectiveness of the present embodiment has been confirmed.

Further, in the present embodiment, the frequency at which the sensitivity becomes maximum can be made higher. FIG. 9 illustrates the maximum sensitivity frequencies of the simple monopole antenna without the exposed ground shield 3*a* and the high-frequency noise detection antennas of the first embodiment and the present embodiment. In FIG. 9, reference numeral 90 denotes the maximum sensitivity frequency of the monopole antenna, reference numeral 91 denotes the maximum sensitivity frequency of the high-frequency noise detection antenna of the first embodiment, and reference numeral 92 denotes the maximum sensitivity frequency of the high-frequency noise detection antenna of the present embodiment.

According to FIG. 9, the maximum sensitivity frequencies of the monopole antenna, the first embodiment, and the present embodiment are 40 GHz, 46 GHz, and 58 GHz, respectively. The reason for the increase in the maximum sensitivity frequency up to 58 GHz in the present embodiment is based on the same principle as the reason for the high maximum sensitivity frequency of the capacitively loaded antenna, and the increase in the maximum sensitivity frequency can be regarded as an effect due to an increase in capacitance between the exposed portion 2 of the center conductor 1-1 and the exposed ground shield 3*a*.

Third Embodiment

Figure 10:
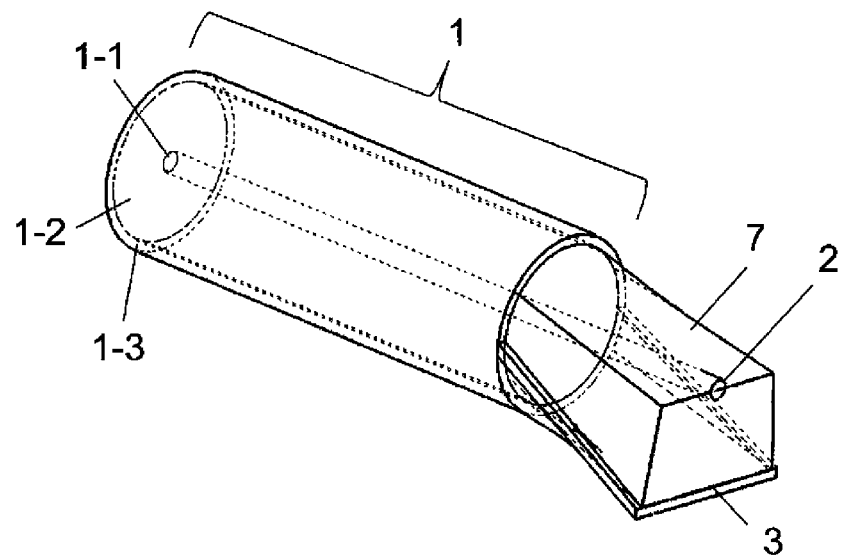
FIG. 10 is an overhead perspective view of a high-frequency noise detection antenna according to a third embodiment of the present invention.

Next, a third embodiment of the present invention will be described. FIG. 10 is an overhead perspective view of a high-frequency noise detection antenna according to the third embodiment of the present invention.

In the high-frequency noise detection antenna of the present embodiment, in contrast to the first embodiment, an insulator 7 having a high dielectric constant characteristic is provided between the exposed portion 2 of the center conductor 1-1 and the exposed ground shield 3. In order to manufacture such an insulator 7, after the exposed ground shield 3 is molded as described in the first embodiment, resin is filled between the exposed portion 2 of the center conductor 1-1 and the exposed ground shield 3.

In the present embodiment, the capacitance between the exposed portion 2 of the center conductor 1-1 and the exposed ground shield 3 is increased by providing the insulator 7, and it is possible to further increase the frequency of the detectable high-frequency noise.

In the present embodiment, most of the center conductor 1-1 exposed in the first embodiment is covered with the insulator 7, but the tip of the center conductor 1-1 is partially exposed in space. The reason for exposing the tip of the center conductor 1-1 is to grasp the relative position of the high-frequency noise antenna and the object to be measured.

Figure 11:
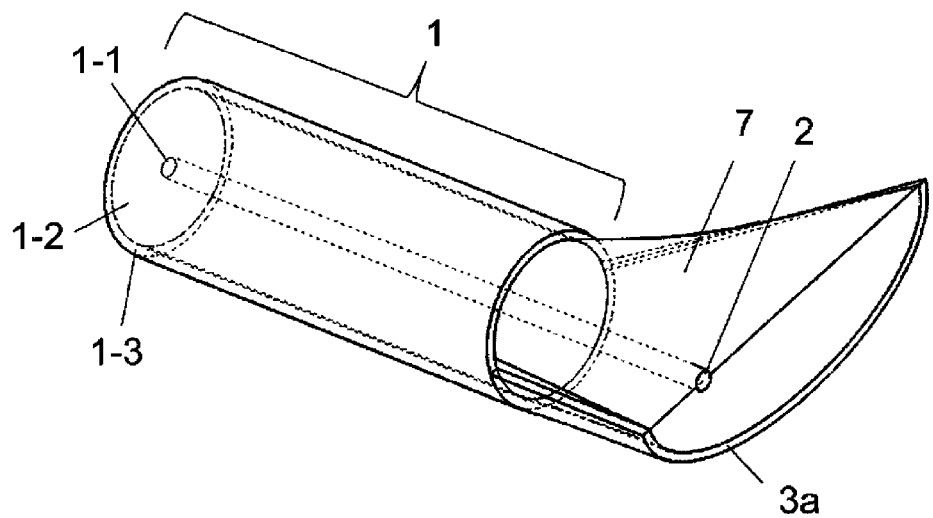
FIG. 11 is an overhead perspective view illustrating another example of the high-frequency noise detection antenna according to the third embodiment of the present invention.
Figure 12:
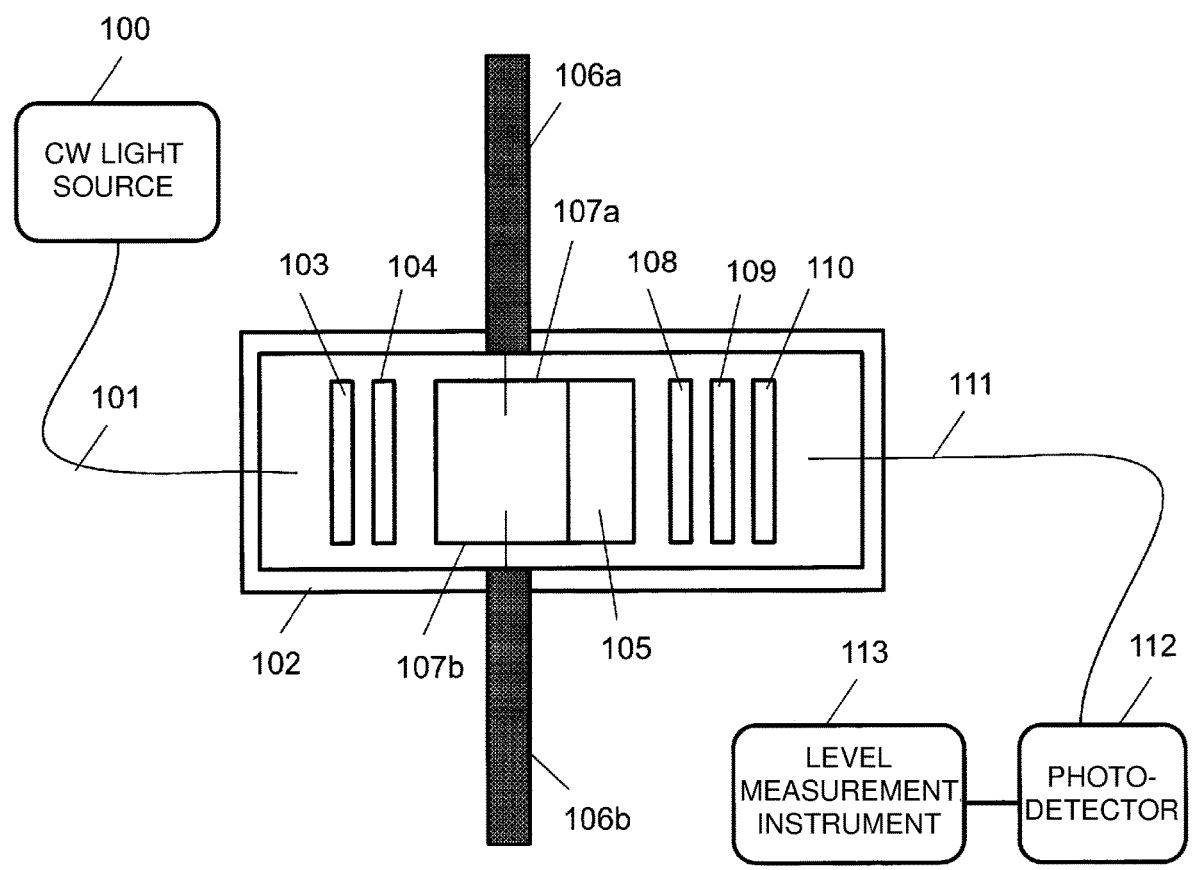
FIG. 12 is a view illustrating a configuration of a conventional electric field sensor.

In the example of FIG. 10, the insulator 7 has been applied to the first embodiment, but the insulator 7 may be applied to the second embodiment. FIG. 11 illustrates an overhead perspective view of the high-frequency noise detection antenna in this case.

As thus described, in the second embodiment as well, the insulator 7 is provided to enable an increase in the frequency of the high-frequency noise that can be detected.

INDUSTRIAL APPLICABILITY

Embodiments of the present invention can be applied to a technique for detecting high-frequency noise.

REFERENCE SIGNS LIST

1 Fine coaxial line
1-1 Center conductor
1-2, 7 Insulator
1-3 Ground shield
2 Exposed portion of center conductor
3, 3*a* Exposed ground shield
3-1 Connection of exposed ground shield
3-2 Tip portion of exposed ground shield
4-1, 4-2 Semi-elliptical confocal point

The invention claimed is:

1. A high-frequency noise detection antenna comprising:
a fine coaxial line comprising a center conductor having a main body and a tip region, a first insulator surrounding a whole periphery of the main body of the center conductor, and a first ground shield surrounding a whole periphery of the first insulator, wherein the tip region is integral with and has a same diameter as the main body, and wherein the tip region of the center conductor protrudes from an end of the first insulator and an end of the first ground shield to define an exposed portion of the center conductor; and
a second ground shield integral with the first ground shield, protruding from the end of the first ground shield, and surrounding in a circumferential direction a part of the exposed portion of the center conductor, wherein the second ground shield has a curved shape, wherein a connection of the second ground shield with the first ground shield has a semicircular shape in a cross-section perpendicular to an extending direction of the center conductor and has a curvature radius equal to a curvature radius of the first ground shield, and wherein an outer tip portion of the second ground shield has a semi-elliptical shape on an end face perpendicular to the extending direction of the center conductor and a position of one of two confocal points of the semi-elliptical end face matches a position of a tip of the exposed portion of the center conductor.

2. The high-frequency noise detection antenna according to claim 1, wherein a length of the exposed portion of the center conductor is ¼ of a wavelength of a high-frequency noise to be detected.

3. The high-frequency noise detection antenna according to claim 1, wherein a straight line connecting a center of the cross-section of the connection of the second ground shield and a center of the end face of the outer tip portion of the second ground shield is non-parallel to a center line of the center conductor.

4. The high-frequency noise detection antenna according to claim 3, further comprising a second insulator between the exposed portion of the center conductor and the second ground shield.

5. The high-frequency noise detection antenna according to claim 1, further comprising an air gap between a lower surface of the exposed portion of the center conductor and the second ground shield.

6. The high-frequency noise detection antenna according to claim 1, wherein the second ground shield is configured to reflect a high-frequency noise to be received by the exposed portion of the center conductor to the exposed portion of the center conductor.

7. A method of forming a high-frequency noise detection antenna, the method comprising:
forming a fine coaxial line comprising a center conductor having a main body and a tip region, a first insulator surrounding a whole periphery of the main body of the center conductor, and a first ground shield surrounding a whole periphery of the first insulator, wherein the tip region is integral with and has a same diameter as the main body, and wherein the tip region of the center conductor protrudes from an end of the first insulator and an end of the first ground shield to define an exposed portion of the center conductor; and forming a second ground shield integral with the first ground shield, protruding from the end of the first ground shield and surrounding in a circumferential direction a part of the exposed portion of the center conductor, wherein the second ground shield has a curved shape, wherein a connection of the second ground shield with the first ground shield has a semicircular shape in a cross-section perpendicular to an extending direction of the center conductor and has a curvature radius equal to a curvature radius of the first ground shield, and wherein an outer tip portion of the second ground shield has a semi-elliptical shape on an end face perpendicular to the extending direction of the center conductor and a position of one of two confocal points of the semi-elliptical end face matches a position of a tip of the exposed portion of the center conductor.

8. The method according to claim 7, wherein a length of the exposed portion of the center conductor is set to ¼ of a wavelength of a high-frequency noise to be detected.

9. The method according to claim 7, wherein a straight line connecting a center of the cross-section of the connection of the second ground shield and a center of the end face of the outer tip portion of the second ground shield is non-parallel to a center line of the center conductor.

10. The method according to claim 7, further comprising forming a second insulator between the exposed portion of the center conductor and the second ground shield.

11. The method according to claim 7, further comprising forming an air gap between a lower surface of the exposed portion of the center conductor and the second ground shield.

12. The method according to claim 7, wherein forming the fine coaxial line comprises:

forming the first insulator to surround the whole periphery of the main body and a whole periphery of the tip region of the center conductor;

forming the first ground shield to surround the whole periphery of the first insulator surrounding the whole periphery of the main body and the whole periphery of the tip region of the center conductor;

removing the first insulator from the whole periphery of the tip region of the center conductor to define the exposed portion of the center conductor; and molding a portion of the first ground shield around the exposed portion of the center conductor to form the second ground shield.

13. The method according to claim 7, wherein forming the second ground shield comprises forming the second ground shield in a shape that reflects a high-frequency noise to be received by the exposed portion of the center conductor to the exposed portion of the center conductor.

\* \* \* \* \*